(12) United States Patent
Akram

(10) Patent No.: US 6,218,259 B1
(45) Date of Patent: Apr. 17, 2001

(54) CAPACITOR AND METHOD FOR FORMING THE SAME

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/334,417

(22) Filed: Jun. 16, 1999

Related U.S. Application Data

(62) Division of application No. 09/100,300, filed on Jun. 19, 1998.

(51) Int. Cl.⁷ .................................................. H01L 21/20
(52) U.S. Cl. .......................... 438/396; 438/241; 438/253
(58) Field of Search ................................. 438/396, 397, 438/398, 399, 239, 241, 253, 255

(56) References Cited

U.S. PATENT DOCUMENTS

| | | | |
|---|---|---|---|
| 5,032,528 | * | 7/1991 | Asao et al. ............................ 438/527 |
| 5,034,351 | * | 7/1991 | Sun et al. ............................. 438/202 |
| 5,124,767 | | 6/1992 | Koyama . |
| 5,137,842 | * | 8/1992 | Chan et al. ........................... 438/254 |
| 5,171,702 | * | 12/1992 | Prengle et al. ....................... 438/254 |
| 5,223,729 | * | 6/1993 | Kudoh et al. ........................ 257/296 |
| 5,227,322 | * | 7/1993 | Ko et al. .............................. 438/387 |
| 5,290,726 | * | 3/1994 | Kim .................................... 438/254 |
| 5,302,844 | | 4/1994 | Mizumo et al. . |
| 5,320,981 | | 6/1994 | Blalock . |
| 5,335,138 | | 8/1994 | Sandhu et al. . |
| 5,381,302 | * | 1/1995 | Sandhu et al. ....................... 361/305 |
| 5,413,950 | | 5/1995 | Chen et al. . |
| 5,416,048 | * | 5/1995 | Blalock et al. ...................... 438/695 |
| 5,476,807 | * | 12/1995 | Lee et al. ............................. 438/396 |
| 5,478,772 | | 12/1995 | Fazan . |
| 5,491,103 | * | 2/1996 | Ahn et al. ............................ 438/396 |
| 5,491,356 | | 2/1996 | Dennison et al. . |
| 5,498,562 | | 3/1996 | Dennison et al. . |
| 5,550,078 | | 8/1996 | Sung . |
| 5,605,858 | | 2/1997 | Nishioka et al. . |
| 5,612,574 | * | 3/1997 | Summerfelt et al. ................ 257/783 |
| 5,656,852 | | 8/1997 | Nishioka et al. . |
| 5,998,825 | | 12/1999 | Ochiai . |

\* cited by examiner

*Primary Examiner*—Carl Whitehead, Jr.
*Assistant Examiner*—Jeff Vockrodt
(74) *Attorney, Agent, or Firm*—Killworth, Gottman, Hagan & Schaeff, LLP

(57) ABSTRACT

A capacitor useful with semiconductor devices and a method for forming such a capacitor is provided. The capacitor comprises a contact formed in a layer of an insulating material of a semiconductor device; a first electrode formed on the layer of insulating material, the first electrode contacting the contact and having a nodular shape; a layer of a dielectric material formed on the first electrode; and a second electrode formed on the layer of the dielectric material. Desirably, the dielectric layer of the capacitor is formed from a high dielectric constant material. In another embodiment, the capacitor includes a layer of a barrier material positioned between the contact and the first electrode.

15 Claims, 8 Drawing Sheets

CAPACITOR AND METHOD FOR FORMING THE SAME

CROSS REFERENCE TO RELATED APPLICATIONS

This application is a division of U.S. patent application Ser. No. 09/100,300, filed Jun. 19, 1998.

FIELD OF THE INVENTION

The present invention is directed to a capacitor for a semiconductor device and a method for forming a capacitor for a semiconductor device. More particularly, the present invention is directed to a capacitor for a semiconductor device having a nodular shaped electrode and a method for forming such an electrode.

BACKGROUND OF THE INVENTION

Advancements in semiconductor manufacture have led to increases in the density and miniaturization of microelectronic circuits. As an example, the manufacture of 1 Gb DRAMs is now possible and 4 Gb prototypes are currently being developed. A key requirement for achieving such high device packing density is the formation of suitable storage capacitors.

With increased packing density of memory cells, however, the area available for storage capacitors (i.e. storage nodes) has decreased. This has necessitated the development of storage capacitors having an increased capacitance. In general, storage capacitors can be formed as stacked structures or as trench structures. The present invention is directed in part to stacked structures and in another part to a combination stacked-trench structure.

Typically, a thin film stacked storage capacitor includes a lower electrode, an upper electrode, and a dielectric layer which is sandwiched between the electrodes. This capacitor structure is stacked on an insulating layer of a substrate. The insulating layer is typically formed from materials such as $SiO_2$ and $Si_3N_4$ that are compatible with a silicon process. The lower electrode of the capacitor is connected to a field effect transistor (FET) formed on the substrate. A polycrystalline silicon layer has been used as the lower electrode of a capacitor. Such a polysilicon layer is sometimes referred to as a polysilicon or silicon electrode.

One way to increase the capacity of this type of capacitor is to use a dielectric layer formed with a high dielectric constant material. These high dielectric constant materials include inorganic non-metallic oxides in the paraelectric or ferro electric phase such as $BaSrTiO_3$ (BST), $BaTiO_3$, $SrTiO_3$, $PbZrO_3$ and others. Such high dielectric constant materials have a dielectric constant greater than 100. This is an order of magnitude larger than traditional dielectric materials, such as $SiO_2$ and $Si_3N_4$, which have dielectric constants less than 10.

A problem with high capacitance capacitors is that generally high dielectric constant films cannot be formed directly over a polysilicon electrode. This is because an interface layer of silicon dioxide forms between the dielectric film and the polysilicon electrode. Such an interface layer reduces the effective dielectric constant of the dielectric material and defeats its purpose. For this reason, the lower electrode structure is typically formed as a stack comprising a barrier layer formed on the polysilicon electrode and a lower electrode formed on the barrier layer.

The barrier layer is typically formed from a conductive material, such as tantalum (Ta), titanium nitride (TiN), or tungsten nitride (WN). Such a barrier layer, in addition to preventing oxidation of the polysilicon electrode, also functions to prevent silicon diffusion into the lower electrode. Such silicon diffusion increases the resistivity of the lower electrode and could lead to the formation of a thin layer of $SiO_2$ layer on top of the lower electrode.

Another problem associated with the use of high dielectric constant films is that these films must be deposited at relatively high temperatures (e.g. 600° C. to 700° C.). Because of the high process temperatures that are required, the lower electrode of such a capacitor is typically formed of a high melting point, non-oxidizing metal such as platinum, palladium or rhodium or of a conducting oxide such as ruthenium oxide, iridium oxide, osmium oxide or rhodium oxide. A non-oxidizing material is required for the lower electrode because a traditional electrode material such as aluminum, titanium, nichrome or copper will oxidize at the high temperatures, increasing the resistivity of the electrode.

A prior art stacked capacitor 10 employing a high dielectric constant dielectric film 26 is shown in FIG. 1. In FIG. 1, a semiconductor substrate 12 includes a FET (not shown) formed with a pair of insulated gate electrodes 14 and 16. An insulating layer 18 is formed over the FET and gate electrodes 14 and 16. The capacitor 10 is stacked on the insulating layer 18. A polysilicon plug 20 is formed in a contact hole formed through the insulating layer 18 to the source or drain region 30 of the FET.

The capacitor 10 includes a lower electrode 22 having a rectangular cross section, an upper electrode 24 and a dielectric film 26 formed between the lower electrode 22 and the upper electrode 24. The capacitor 10 also includes a barrier layer 28 formed between the lower electrode 22 and the polysilicon plug 20.

Such a capacitor is subject to several limitations. First, the dielectric layer 26 must be formed over the stepped surface contour provided by the stack formed by the lower electrode 22 and the barrier layer 28. Poor step coverage of the dielectric material 28 over the lower electrode 22 promotes charge leakage at the corners of the dielectric material 26 in the completed capacitor structure. To prevent this leakage, an insulating material such as silicon dioxide is sometimes deposited over the outside corners of the dielectric film 26.

Second, the sidewalls 34 and 36 of the barrier layer 28 are exposed to oxidation during deposition of the dielectric film 26. Accordingly, the high temperatures encountered during the dielectric deposition process will cause the sidewalls of the barrier layer 28 to oxidize. Such an oxide increases the contact resistance of the barrier layer 28. Further, with an oxide formed on the sidewalls 34 and 36 of the barrier layer 28, the lower electrode 22 will not adhere as well to the barrier layer 28 which results in the lower electrode 22 separating from the barrier layer 28.

Third, if the barrier layer 28 does not completely overlap the polysilicon plug 20, then the surface of the polysilicon plug will oxidize during the deposition of the dielectric material 26. A critical alignment of the barrier layer 28 and the polysilicon plug 20 is required.

A solution to these problems is provided by U.S. Pat. No. 5,335,138 to Sandhu et al. This patent teaches the use of spacers positioned at each end of the lower electrode-barrier layer stack to prevent oxidation of the sidewalls of the barrier layer during deposition of the dielectric film. These spacers also provide a smooth topography for the deposition of the dielectric film. This provides the completed capacitor with a smooth topography which prevents the current leakage which occurs through sharp corners of the dielectric layer. Finally, the spacers provide a larger area for protection of the polysilicon plug from oxidation. However, the process described by Sandhu et al. requires additional processing steps and time to form the spacers.

For these reasons, a need exists in the art for a capacitor which is not subject to the limitations of the prior art. Particularly, a need exists in the art for a capacitor and a method for making a capacitor which has step coverage which eliminates charge leakage. A need also exists for a capacitor and a method for making a capacitor which prevents oxidation of the sidewalls of the lower electrode and the barrier layer. Another need exists for a capacitor and a method for making a capacitor which provide for proper placement of the lower electrode and barrier layer over the polysilicon plug. Finally, a need exists in the art for a method of making such a capacitor which will quickly and efficiently address the current needs in the art.

SUMMARY OF THE INVENTION

The present invention provides a high dielectric constant capacitor and a method for manufacturing such a capacitor. The present invention provides a capacitor with minimized current leakage, a capacitor which does not experience oxidation of the barrier layer or lower electrode during processing, and a capacitor in which the polysilicon contact is not exposed to oxidation by the barrier layer.

One aspect of the present invention is directed to a method for forming a capacitor for a semiconductor device. The method comprises the steps of: forming a contact in a layer of an insulating material, the layer of insulating material being formed over a semiconductor substrate; forming a layer of a first electrode material on the layer of insulating material, the layer of the first electrode material being formed in contact with the contact; etching the layer of the first electrode material to form a first electrode having a nodular shape; forming a layer of a dielectric material on the first electrode; and forming a second electrode on the layer of the dielectric material. In this method, the step of etching the layer of the first electrode material can be performed by either a wet etch or a facet etch.

Another aspect of the present invention is directed to another method for forming a capacitor for a semiconductor device. This method comprises the steps of: forming a contact in a layer of an insulating material, the layer of insulating material being formed over a semiconductor substrate; etching the contact to form a barrier hole; forming a layer of a barrier material in the barrier hole such that the layer of barrier material contacts the contact and is substantially coplanar with the surface of the layer of insulating material; forming a layer of a first electrode material on the layer of barrier material, the layer of first electrode material being formed on the layer of insulating material; etching the layer of the first electrode material to form a first electrode having a nodular shape; forming a layer of a dielectric material on the first electrode; and forming a second electrode on the layer of the dielectric material. In this aspect of the invention, the step of etching the first electrode can be performed by either a wet etch or a facet etch.

In an alternative embodiment of the present invention, a capacitor for a semiconductor device is formed by the steps of forming a contact in a layer of an insulating material, the layer of insulating material being formed over a semiconductor substrate; etching the contact to form a barrier hole; forming a layer of a barrier material in the barrier hole such that the layer of barrier material contacts the contact and is substantially coplanar with the surface of the layer of insulating material; forming a layer of a sacrificial material on the layer of barrier material, the layer of sacrificial material being formed on the layer of insulating material; etching an opening in the layer of sacrificial material to expose the layer of barrier material; forming a first electrode in the opening on the layer of barrier material; removing the layer of sacrificial material; forming a layer of a dielectric material on the first electrode; and forming a second electrode on the layer of the dielectric material.

A further aspect of the present invention is directed to a method for forming a semiconductor device. This method comprises the steps of: providing a semiconductor substrate; forming a layer of an insulating material over the semiconductor substrate, the layer of insulating material having a surface; forming a contact via in the layer of the insulating material; depositing a contact in the contact via; planarizing the contact to make the contact substantially coplanar with the surface of the layer of insulation material; depositing a layer of a first electrode material on the surface of the layer of insulation material, the first electrode material contacting the contact; etching the layer of the first electrode material to form a first electrode having a nodular shape; forming a layer of dielectric material on the first electrode; and forming a second electrode on the layer of dielectric material. In this aspect of the invention, the step of etching the block of the first electrode material to form a first electrode having a nodular shape is performed with either a wet etch process or a facet etch process.

A still further aspect of the present invention is directed to a method for forming a semiconductor device. This method comprises the steps of: providing a semiconductor substrate; forming a layer of an insulating material over the semiconductor substrate, the layer of insulating material having a surface; forming a contact via in the layer of the insulating material; depositing a contact in the contact via; planarizing the contact to make the contact substantially coplanar with the surface of the layer of insulation material; over etching the contact to form a barrier hole; forming a layer of a barrier material in the barrier hole; polishing the layer of barrier material so that the layer of barrier material has a surface which is substantially coplanar with the surface of the layer of insulating material; depositing a layer of a first electrode material on the surface of the layer of insulation material, the first electrode material contacting the layer of barrier material; etching the layer of the first electrode material to form a first electrode having a nodular shape; forming a layer of dielectric material on the first electrode; and forming a second electrode on the layer of dielectric material. In this method, the step of etching the block of the first electrode material to form a first electrode having a nodular shape is performed by either a wet etch process or a facet etch process.

Another aspect of the present invention is directed to a process for forming a memory array. The memory array comprises a plurality of memory cells arranged in rows and columns with each of the plurality of memory cells comprising at least one field effect transistor. The method comprises the steps of: providing a semiconductor substrate; forming sources, drains and gates for each of the field effect transistors on the semiconductor substrate; forming a layer of an insulating material over the semiconductor substrate; forming at least one contact via in the layer of insulating material, each of the contact vias communicating with one of the sources or the drains of one of the field effect transistors; forming a contact in each of the contact vias, each of the contacts contacting one of the sources or the drains of one of the field effect transistors; forming a layer of a first electrode material on the layer of insulating material on each of the contacts; etching each of the layers of first electrode material to provide a series of first electrodes, each of the first electrodes having a nodular shape and contacting the contacts; forming a layer of a dielectric material on each of the first electrodes; and forming a second electrode on each of the layers of dielectric material. In this method, the step of etching each of layers of first electrode material to provide a series of first electrodes is performed by either a wet etch process or a facet etch process.

Another aspect of the present invention is directed to a method for forming a memory array. The memory array comprises a plurality of memory cells arranged in rows and columns. Each of the plurality of memory cells comprises at least one field effect transistor. The method comprises the steps of: providing a semiconductor substrate; forming sources, drains and gates for each of the field effect transistors on the semiconductor substrate; forming a layer of an insulating material over the semiconductor substrate; forming at least one contact via in the layer of insulating material, each of the contact vias communicating with one of the source or the drain of one of the field effect transistors; forming a contact in each of the contact vias, each of the contacts contacting one of the sources or the drains of one of the field effect transistors; etching each of the contacts to provide a series of barrier holes; forming a layer of a barrier material in each of the barrier holes; forming a layer of a first electrode material on the layer of insulating material on each of the layers of barrier material; etching each of the layers of the first electrode material to provide a series of first electrodes, each of the first electrodes having a nodular shape; forming a layer of a dielectric material on each of the first electrodes; and forming a second electrode on each of the layers of dielectric material. In this method, the step of etching each of the layers of first electrode material to provide a series of first electrodes is performed by means of either a wet etch process or a facet etch process.

Still another aspect of the present invention is directed to a method for fabricating a wafer. The method comprises the steps of: providing a wafer including a semiconductor substrate; forming a repeating series of sources, drains and gates for at least one field effect transistor on each of a plurality of individual die over the semiconductor substrate; forming a layer of an insulating material over the semiconductor substrate, the layer of insulating material having a surface; forming at least one contact via in the layer of insulating material on each of the individual die, the via exposing one of the sources or the drains; forming a contact in each of the contact vias on each of the individual die, the contact contacting one of the sources or the drains and the contact being substantially coplanar with the surface of the layer of insulating material; forming a layer of a first electrode material on the contact on the surface of the layer of insulating material on each of the individual die; etching each of the layers of first electrode material to form a series of first electrodes having a nodular shape on each of the individual die; forming a layer of a dielectric material on each of the first electrodes on each of the individual die; and forming a second electrode on each of the layers of dielectric material on each of the individual die. With this method, the step of etching the layer of first electrode material is performed with either a wet etch or a facet etch.

Still another aspect of the present invention is directed to a method for fabricating a wafer. The method comprises the steps of: providing a wafer including a semiconductor substrate; forming a repeating series of sources, drains and gates for at least one field effect transistor on each of a plurality of individual die on the semiconductor substrate; forming a layer of an insulating material over the semiconductor substrate, the layer of insulating material having a surface; forming at least one contact via in the layer of insulating material on each of the individual die, the contact via exposing one of the sources or the drains; forming a contact in each of the contact vias on each of the individual die, the contact contacting one of the sources or the drains and the contact being substantially coplanar with the surface of the layer of insulating material; etching each of the contacts to form a barrier hole in each of the individual die; forming a layer of a barrier material in each of the barrier holes on each of the individual die, the barrier material being flush with the surface of the layer of insulating material; forming a layer of a first electrode material on each of the layers of barrier material on the surface of the layer of insulating material on each of the individual die; etching each of the layers of first electrode material to form a series of first electrodes having a nodular shape on each of the individual die; forming a layer of a dielectric material on each of the first electrodes on each of the individual die; and forming a second electrode on each of the layers of dielectric material on each of the individual die. In this aspect of the invention, the step of etching the layer of first electrode material is performed with either a wet etch or a facet etch.

A further aspect of the present invention is directed to a capacitor for a semiconductor device. The capacitor comprises a contact which is formed in a layer of insulating material of the semiconductor device. A first electrode is formed on the layer of insulating material. The first electrode contacts the contact and has a nodular shape. A layer of a dielectric material is formed on the first electrode. Finally, a second electrode is formed on the layer of the dielectric material.

A still further aspect of the present invention is directed to a capacitor for a semiconductor device. The capacitor includes a contact which is formed in a layer of insulating material of the semiconductor device. A layer of a barrier material is also formed in the layer of insulation material. The layer of barrier material contacts the contact. A first electrode is formed on the layer of insulating material and contacts the layer of barrier material. The first electrode has a nodular shape. A layer of a dielectric material is formed on the first electrode. Finally, a second electrode is formed on the layer of the dielectric material.

An additional aspect of the present invention is directed to a semiconductor device. The semiconductor devices includes a semiconductor substrate. A layer of an insulating material is formed over the semiconductor substrate. The layer of the insulating material defines a contact via. A contact is formed in the contact via. A first electrode is formed on the layer of insulating material. The first electrode contacts the contact and has a nodular shape. A layer of a dielectric material is formed on the first electrode and a second electrode is formed on the layer of the dielectric material.

Another aspect of the present invention is directed to a semiconductor device. The device includes a semiconductor substrate. A layer of an insulating material is formed over the semiconductor substrate. The layer defines a contact via with the semiconductor substrate. A contact is formed in the contact via. A layer of a barrier material is formed in the contact via and contacts the contact. A first electrode is formed on the layer of insulating material. The first electrode contacts the layer of barrier material and has a nodular shape. A layer of a dielectric material is formed on the first electrode and a second electrode is formed on the layer of the dielectric material.

Yet another aspect of the present invention is directed to a memory cell. The memory cell includes a semiconductor substrate having at least one field effect transistor formed therein. A layer of an insulating material is formed over the field effect transistor. The layer defines a contact via with the field effect transistor. A contact is formed in the contact via and contacts the field effect transistor. A capacitor is coupled to the field effect transistor by the contact. The capacitor includes a first electrode formed on the layer of insulating material, the first electrode contacting the contact and having a nodular shape; a layer of a dielectric material formed on the first electrode; and a second electrode formed on the layer of the dielectric material.

Still another aspect of the present invention is directed to a memory cell. The memory cell includes a semiconductor substrate. A field effect transistor is formed in the semiconductor substrate. A layer of an insulating material is formed over the field effect transistor. The layer of insulating material defines a contact via with the field effect transistor. A contact is formed in the contact via such that the contact fills at least a portion of the contact via and the contact contacts the field effect transistor. A layer of a barrier material is also formed in the contact via. The layer of barrier material contacts the contact. A capacitor is coupled to the field effect transistor by the layer of the barrier material through the contact. The capacitor includes a first electrode formed on the layer of insulating material, the first electrode contacting the layer of barrier material and the first electrode having a nodular shape; a layer of a dielectric material formed on the first electrode; and a second electrode formed on the layer of the dielectric material.

A further aspect of the present invention is directed to a memory array. The memory array comprises a plurality of memory cells arranged in rows and columns. Each of the memory cells includes a semiconductor substrate. At least one field effect transistor is formed on the semiconductor substrate. A layer of an insulating material is formed over the semiconductor substrate. The layer of the insulating material defines a contact via with the field effect transistor. A contact is formed in the contact via. The contact contacts the field effect transistor. A capacitor is coupled to the field effect transistor by the contact. The capacitor includes a first electrode formed on the layer of insulating material, the first electrode contacting the contact and having a nodular shape; a layer of a dielectric material formed on the first electrode; and a second electrode formed on the layer of the dielectric material.

A still further aspect of the present invention is directed to a memory array. The memory array comprises a plurality of memory cells arranged in rows and columns. Each of the memory cells comprises a semiconductor substrate. At least one field effect transistor is formed on the semiconductor substrate. A layer of an insulating material is formed over the semiconductor substrate. The layer of the insulating material defines a contact via with the field effect transistor. A contact is formed in the contact via and the contact contacts the field effect transistor. A capacitor is coupled to the field effect transistor by the contact. The capacitor includes a first electrode formed on the layer of insulating material, the first electrode contacting the contact and having a nodular shape; a layer of a dielectric material formed on the first electrode; and a second electrode formed on the layer of the dielectric material.

Yet still another aspect of the present invention is directed to a semiconductor wafer. The wafer includes a semiconductor substrate. A repeating series of sources, drains and gates for at least one field effect transistor are formed on each of a plurality of die on the wafer. The series of sources, drains and gates are formed over the semiconductor substrate. A layer of an insulating material is formed over the semiconductor substrate. The layer of insulating material defines a series of contact vias for each of the field effect transistors. A contact is formed in each of the contact vias. Each of the contacts contacts one of the sources, drains or gates of the field effect transistor. At least one capacitor is formed on each of the plurality of individual die. Each of the capacitors is coupled to one of the field effect transistors by one of the contacts. Each of the capacitors includes a first electrode formed on the layer of insulating material, the first electrode contacting the contact and having a nodular shape; a layer of a dielectric material formed on the first electrode; and a second electrode formed on the layer of the dielectric material.

A still further aspect of the present invention is directed to a semiconductor wafer. The wafer includes a semiconductor substrate. A repeating series of sources, drains and gates for at least one field effect transistor is formed on each of a plurality of die on the wafer. The series of sources, drains and gates is formed over the semiconductor substrate. A layer of an insulating material is formed over the semiconductor substrate. The layer of insulating material defines a series of contact vias for each of the field effect transistors. A contact is formed in at least a portion of each of the contact vias. Each of the contacts contacts one of the sources, drains or gates of the field effect transistor. A layer of a barrier material is formed in each of the contact vias. The layer of barrier material contacts the contact. At least one capacitor is formed on each of the plurality of individual die. Each of the capacitors is coupled to one of the field effect transistors by one of the layers of barrier material and one of the contacts. Each of the capacitors includes a first electrode formed on the layer of insulating material, the first electrode contacting the layer of barrier material and having a nodular shape; a layer of a dielectric material formed on the first electrode; and a second electrode formed on the layer of the dielectric material.

Other objects and advantages of the invention will be apparent from the following detailed description, the accompanying drawings and the appended claims.

DETAILED DESCRIPTION OF THE INVENTION

For the purposes of the present application, the preposition "on" refers to formation in contact with a surface or layer and the preposition "over" refers to formation above or in contact with a surface or layer.

Figure 2:
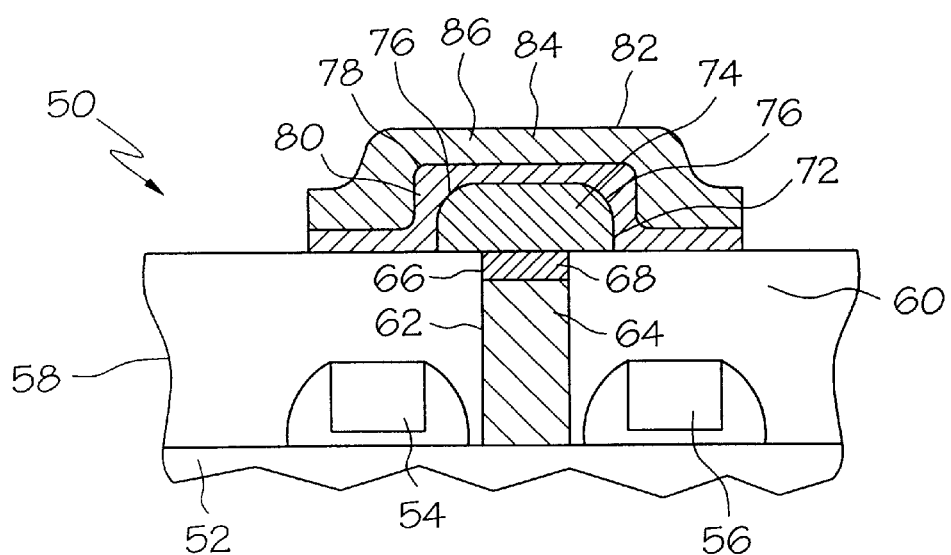
FIG. 2 presents a cross sectional view of one embodiment of a capacitor of the present invention.

A capacitor 50 of the present invention is shown in FIG. 2. The capacitor 50 is formed over a semiconductor substrate 52 which includes a first gate electrode 54 and a second gate electrode 56 of a field effect transistor (FET), not shown. As used herein, the term "semiconductor substrate" refers to a layer of a substrate material or a layer of a substrate material with additional structures or layers formed thereon. A layer 58 of an insulating material 60 is formed over the semiconductor substrate 52 and over the FET and the gate electrodes 54 and 56. The layer 58 of insulating material 60 defines a contact via 62. A contact 64 is formed in the contact via 62 in the layer 58 of insulating material 60. The contact 64 contacts the FET. A layer 66 of a barrier material 68 is also formed in the contact via 62 in the layer 58 of insulating material 60. The layer 66 of barrier material 68 contacts contact 64.

A first electrode 72 formed from an electrode material 74 and having a nodular shape contacts the layer 66 of barrier material 68. The first electrode 72 is formed on the surface of the layer 58 of insulating material 60 and has a cross sectional width which is greater than or equal to the width of the contact 64. Desirably, the first electrode 72 is wider than the contact 64. The electrode 72, as shown in FIG. 2, has curved corners 76.

A layer 78 of a dielectric material 80 is formed on the first electrode 72. The layer 78 is formed so that it conforms to the topology of the first electrode 72. A layer 82 of a second electrode material 84 is formed on the layer 78 of dielectric material 80 to provide a second electrode 86 for the capacitor 50. The layer 82 conforms to the topology of the layer 78.

Figure 3:
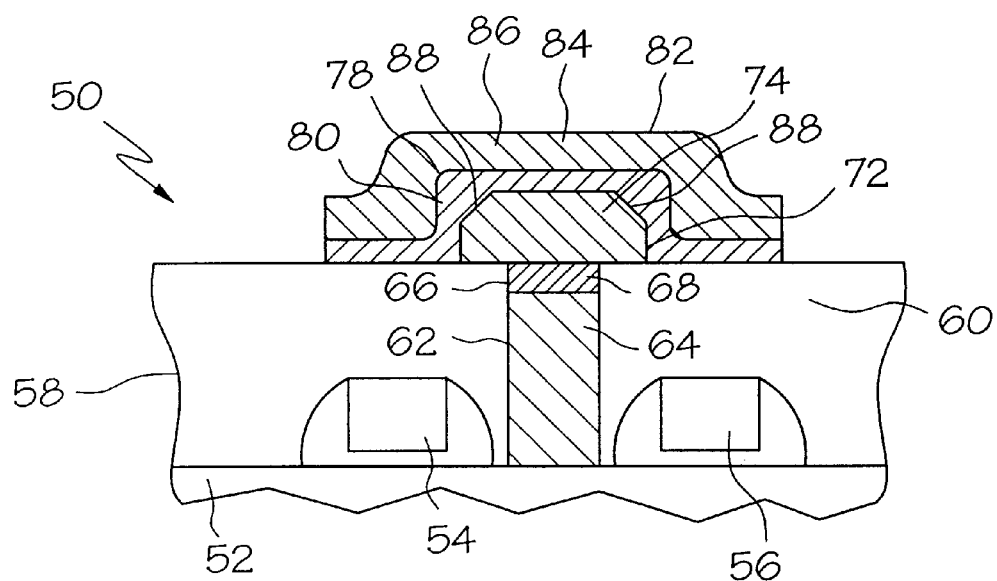
FIG. 3 presents a cross sectional view of another embodiment of a capacitor of the present invention.

An alternate embodiment of the capacitor 50 is shown in FIG. 3. In FIG. 3, the reference numerals identify the same parts as they do in FIG. 2. In the alternate embodiment shown in FIG. 3, the first electrode 72 has faceted corners 88, rather than curved corners 76 as shown in FIG. 2, to provide the first electrode 72 with a nodular shape.

Figure 4:
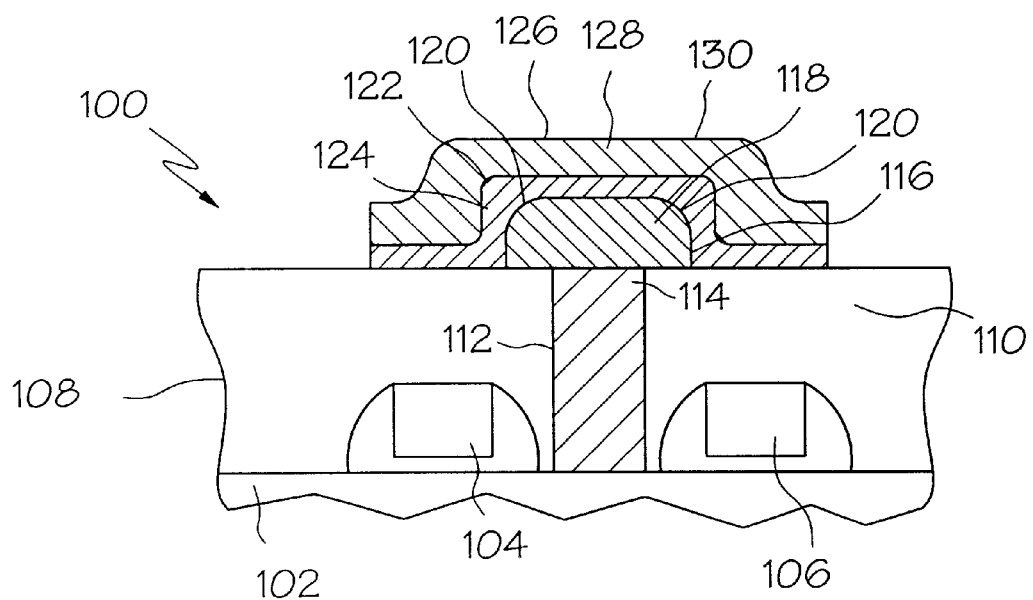
FIG. 4 presents a cross section view of still another embodiment of a capacitor of the present invention.

Another capacitor 100 of the present invention is shown in FIG. 4. The capacitor 100 is formed over a semiconductor substrate 102 which includes a first gate electrode 104 and a second gate electrode 106 of a field effect transistor (FET), not shown. A layer 108 of an insulating material 110 is formed over the semiconductor substrate 102 and the FET and the gate electrodes 104 and 106. The layer 108 of insulating material 110 defines a contact via 112. A contact 114 is formed in the contact via 112 in the layer 108 of insulating material 110. The contact 114 contacts the FET.

A first electrode 116 formed from an electrode material 118 and having a nodular shape contacts the contact 114. The first electrode 116 is formed on the surface of the layer 108 of insulating material 110 and has a cross sectional width which is greater than or equal to the width of the contact 114. Desirably, the first electrode 116 has a cross sectional width greater than that of the contact 114. The first electrode 116, as shown in FIG. 4, has curved corners 120.

A layer 122 of a dielectric material 124 is formed on the first electrode 116. The layer 122 is formed so that it conforms to the topology of the first electrode 116. A layer 126 of a second electrode material 128 is formed on the layer 128 of dielectric material 124 to provide a second electrode 130 for the capacitor 100. The layer 126 conforms to the topology of the layer 122.

Figure 5:
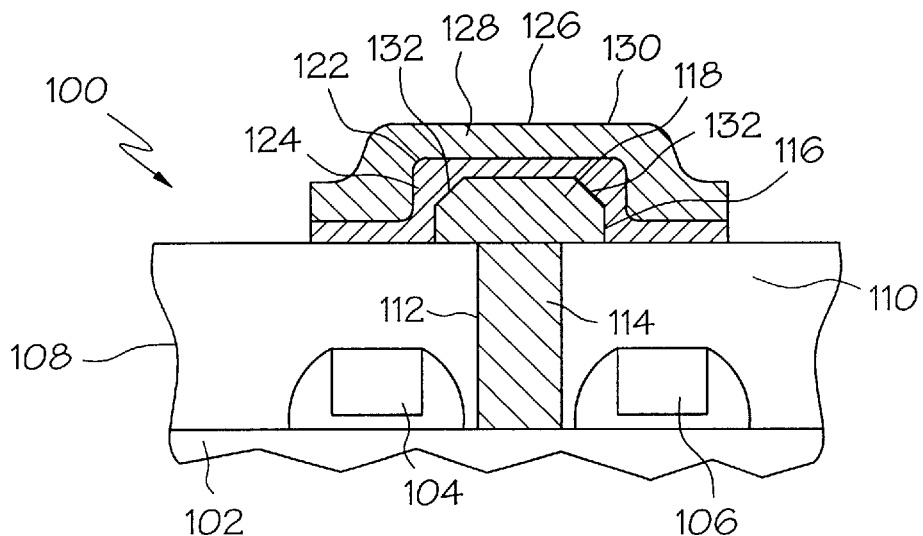
FIG. 5 presents a cross sectional view of even another embodiment of a capacitor of the present invention.

An alternate embodiment of the capacitor 100 is shown in FIG. 5. In FIG. 5, the reference numerals indicate the same parts as they do in FIG. 4. In the embodiment shown in FIG. 5, the first electrode 116 has faceted corners 130, rather than curved corners 120 as shown in FIG. 4, to provide the first electrode 116 with a nodular shape.

As used herein to define the present invention, the term "nodular shape" means a structure having a finite cross section which includes a curved or partially curved cross section, and a partially square or rectangular cross section having curved corners, partially curved corners or faceted corners and having a width equal to or greater than the width of the contact 64 or 114. The term "nodular shape" does not incorporate either a square cross section or a rectangular cross section. The nodular shape of the first electrodes 72 and 116 renders unnecessary the use of spacers, such as those described in U.S. Pat. No. 5,335,138, to provide a smooth topography for deposition of the dielectric layer and the second electrode, thus, eliminating additional processing steps.

The semiconductor substrates 52 and 102 are formed from any material currently in use in the art which is used to form substrates for semiconductor devices such as semiconductor devices 50 and 100. Useful materials include, but are not limited to, doped or undoped silicon, doped or undoped polycrystalline silicon, gallium arsenide, gallium phosphide and indium phosphide.

The contacts 64 and 114 are formed from any material currently in use in the art to form contacts or, as they are alternately known, plugs. Useful materials include, but are not limited to, polysilicon, tungsten, and tungsten nitride.

The barrier material 68 can be any material currently in use in the art to form barrier layers in semiconductor devices. Useful materials include, but are not limited to, tantalum, titanium nitride, and titanium tungsten. Other useful materials include tungsten, molybdenum and their alloys. Silicides of these metals are also useful as is tungsten nitride.

The first electrode material 74 and 118 is any material currently in use in the art to form electrodes for capacitors for semiconductor devices. Desirably, the first electrode material 74 and 118 is selected from the group consisting of copper, platinum, tantalum, titanium, tungsten, palladium, rhodium, ruthenium, iridium, osmium and their oxides. Also useful for the first electrode material 74 and 118 are tantalum nitride and titanium nitride. The second electrode material 84 and 128 is also any material currently in use in the art to form electrodes for capacitors for semiconductor devices. Desirably, the second electrode material 84 and 128 is selected from the group consisting of copper, platinum, tantalum, titanium, tungsten palladium, rhodium, ruthenium, iridium, osmium and their oxides.

The dielectric material 80 and 124 is any material currently in use in the art to form dielectrics for capacitors for semiconductor devices. Desirably, the dielectric material 80 and 124 is a high dielectric constant material. In addition to having a high dielectric constant, these materials must exhibit low current leakage and high reliability for voltage stress. Useful materials include, but are not limited to, BaSrTiO$_3$ (BST), BaTiO$_3$, SrTiO$_3$, PbZrO$_3$, PZT and PLZT or any other inorganic non-metallic oxide having a relatively high dielectric constant. As stated above, these materials have dielectric constants greater than 100 to provide an increased capacitance for the capacitors of the present invention.

Figure 6A:
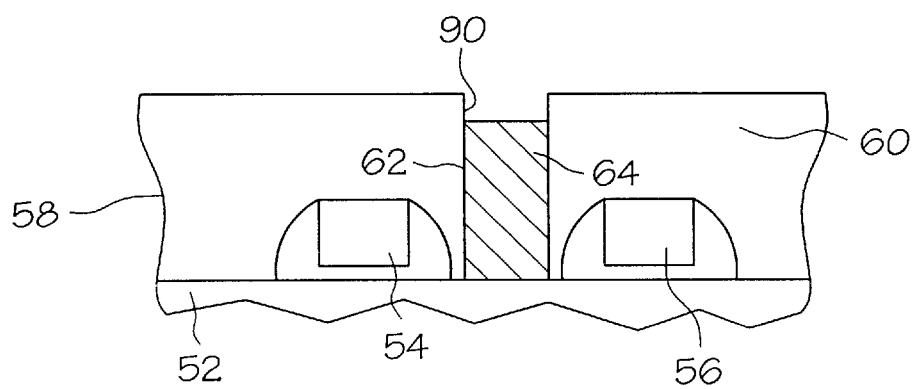
FIGS. 6A–6E are cross sectional views depicting the formation of the capacitors shown in FIGS. 2 and 3.

FIGS. 6A through 6E depict various steps in the process for forming the capacitor 50. As shown in FIG. 6A, the layer 58 of insulating material 60 is formed on the semiconductor substrate 52. The layer 58 of insulating material 60 is formed over the first gate electrode 54 and the second gate electrode 56 of the FET, not shown, by techniques which are known in the art. The contact via 62 is formed in the layer 58 of insulating material 60 by any conventional etching technique such as plasma etching, ion beam etching or reactive ion etching. Desirably, the contact via 62 is formed by plasma etching. The contact via 62 may alternately be formed by an isotropic etch using hydrofluoric acid or any other acid currently used in the art to wet etch materials.

After the contact via 62 is formed in the layer 58 of insulating material 60, the contact 64 is formed in the contact via 62. The contact 64 is formed by any conventional deposition process, such as, chemical vapor deposition (CVD), LPCVD, PECVD, MOCVD or sputtering. Desirably, the contact 64 is formed by CVD. It is further desirable that the contact 64 be planarized to make the contact 64 substantially coplanar with the surface of the layer 58 of insulating material 60. The contact 64 is planarized by either a dry etch or by chemical mechanical polishing. Desirably, the contact 64 is planarized by chemical mechanical polishing. After the contact 64 has been deposited in the contact via 62 and optionally planarized, the contact 64 is then over etched to form a barrier hole 90. The barrier hole 90 is formed by etching the contact 64 to a level below the surface of the layer 58 of insulating material 60. Desirably, the contact 64 is etched to a depth from about 10 nm to about 500 nm below the surface of the layer 58 of insulating material 60.

Figure 6B:
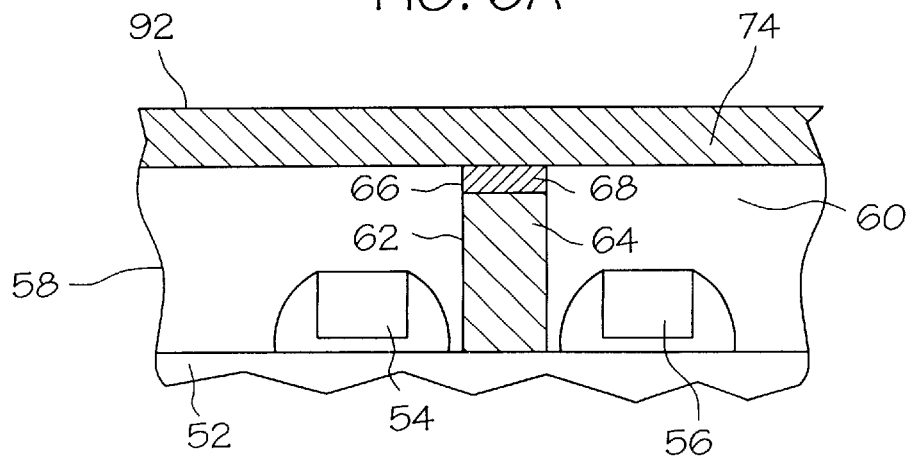

As shown in FIG. 6B, once the barrier hole 90 has been formed, a layer 66 of barrier material 68 is formed in the barrier hole 90. The layer 66 is formed in the barrier hole 90 by any conventional deposition process, such as, chemical vapor deposition (CVD), LPCVD, PECVD, MOCVD or sputtering. Once the layer 66 of barrier material 68 has been formed in the barrier hole 90, the layer 66 is desirably planarized to make it substantially coplanar with the surface of the layer 58 of insulating material 60. The planarizing is accomplished either by a conventional etching process or by chemical mechanical polishing. Desirably, the layer 66 is planarized by a chemical mechanical polishing process. The completed layer 66 of barrier material 68 desirably has a thickness of from about 10 nm to about 500 nm, depending on the depth to which the contact 64 was etched. By forming the layer 66 of barrier material 68 in the contact via 62, the opportunity for the layer 66 of barrier material 68 to oxidize during deposition of the electrode materials is reduced, if not eliminated. The opportunity for the layer 66 of barrier material 68 to oxidize is reduced because the sides of the layer 66 of barrier material 68 are no longer exposed during the deposition of the electrode material 74.

After the layer 66 of barrier material 68 has been planarized, a layer 92 of electrode material 74 is formed on the surface of the layer 66 of insulating material 68. The layer 92 of electrode material 74 is deposited by CVD, LPCVD, PECVD, MOCVD, sputtering or other suitable deposition technique. The layer 92 is deposited at a thickness on the order of from about 10 nm to about 100 nm.

Figure 6C:
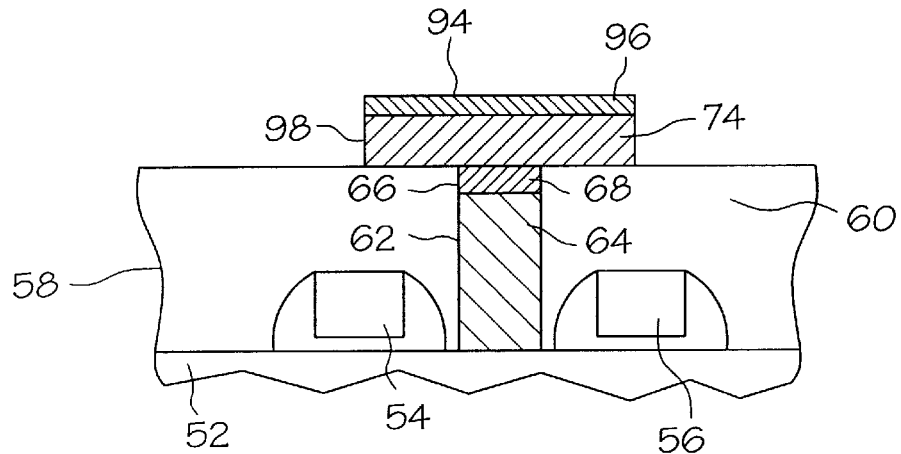

As shown in FIG. 6C, a layer 94 of a photoresist material 96 is formed on the electrode material 74. The layer 94 of photoresist material 96 is then patterned and etched to form a block 98 of electrode material 74 on the surface of the layer 58 of insulating material 60. The block 98 is formed by any conventional etching method, either by a wet etch or a dry etch. Desirably, the block 98 is formed by means of a dry etch to avoid any undercutting which often occurs with wet etching processes. The block 98 is formed by the etching processes so that it has a discrete and finite shape. In other words, the layer 92 of electrode material 74 is etched so that it no longer has a continuous or semi-continuous form. The length of the block 98 depends upon the width of the layer 66 of barrier material 68.

Figure 6D:
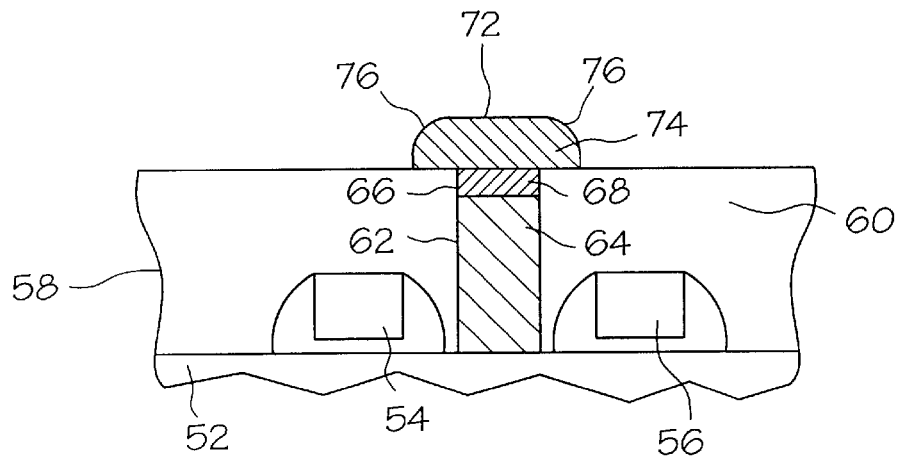

The block 98 of electrode material 74, shown in FIG. 6C, is etched to form the electrode 72, as shown in FIG. 6D. In FIG. 6D, the electrode 72 is formed by either a wet etch or a facet etch so that the electrode 72 is provided with a nodular shape. The nodular shape of the electrode 72 can be formed by a wet etch process or a dry isotropic etch process. If a wet etch is used, it provides electrode 72 with the curved or rounded corners 76. Depending on the length of time that the block 98 is exposed to the etchant, the cross sectional shape of the electrode 72 will vary from a partially square or rectangular cross section with curved corners to a curved cross section. One of skill in the art will appreciate that extensive etching of the block 98 will eventually render the resulting electrode 72 useless.

Figure 6E:
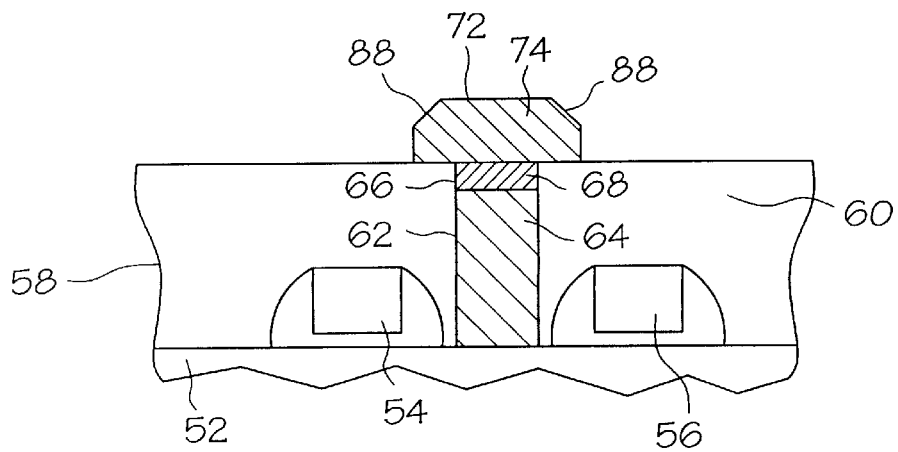

Alternately, the block 98 of electrode material 74, shown in FIG. 6C, can alternately be facet etched to provide the electrode 72 with faceted corners 88 and the nodular shape, as shown in FIG. 6E. A useful facet etching process is described in commonly assigned U.S. Pat. No. 5,320,981 to Blalock which is hereby incorporated by reference in its entirety. In the Blalock process, a plasma etch is conducted with an inert material, such as argon, krypton or xenon, so that as close as possible to a purely physical, as opposed to chemical, erosion takes place. This type of etch removes material at the corners of the block 98 of electrode material 74 at a rate of up to four times the removal rate of a surface perpendicular to the source of the etch. This etch causes the corners to be eroded at approximately 45° angles. However, one of skill in the art will appreciate that any of the currently used etching processes are useful to form facets on the corners of the block 98.

Figure 10A:
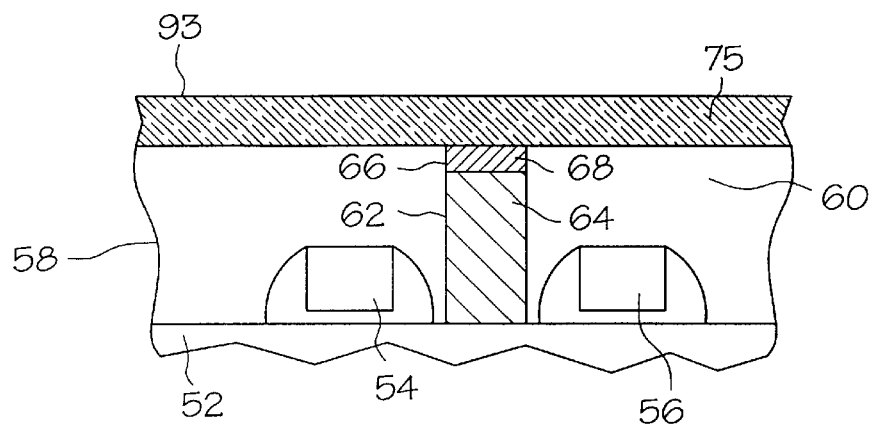
FIGS. 10A–10C are cross sectional views of an alternative embodiment for forming the capacitors shown in FIGS. 2 and 3.
Figure 10B:
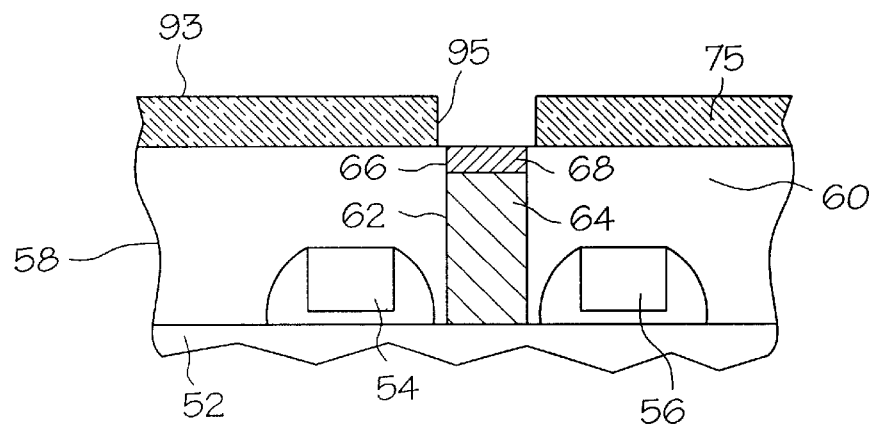
Figure 10C:
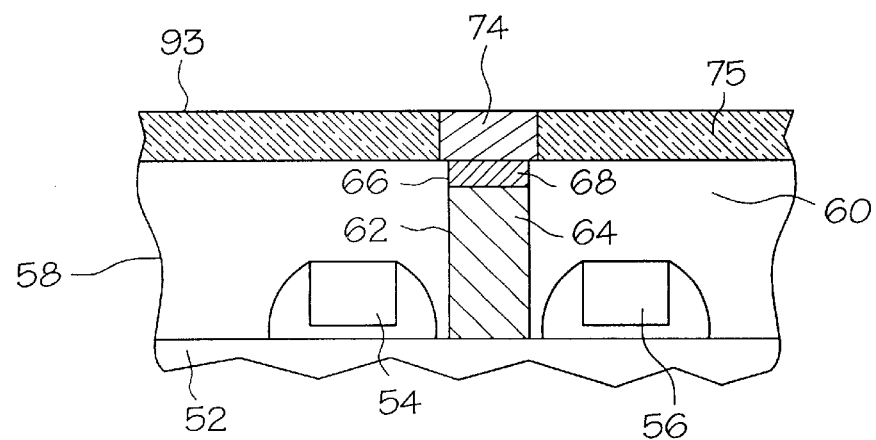

An alternative method of forming capacitor 50 is shown in FIGS. 10A–10C, where like elements are depicted by like reference numerals. In this embodiment, the device is formed as shown in FIG. 6A, and a layer 66 of barrier material 68 is formed in barrier hole 90 as described above and is planarized to make it substantially coplanar with the surface 58 of insulating material 60. After the layer 66 of barrier material 68 has been planarized, a layer 93 of a sacrificial material 75 is formed on layer 66 of the barrier material as well as on layer 58 of the insulating material. Sacrificial material 75 may comprise, for example, a layer of a borophosphosilicate glass (BPSG) or other readily etchable material.

As shown in FIG. 10B, an opening 95 is then etched in layer 93, using a suitable etchant process, until layer 66 of barrier material 68 is exposed. For example, the surface of sacrificial layer 93 may be suitably masked and then etched. An electrode material 74, such as for example, platinum metal, is then deposited over layer 93, filling opening 95. Electrode material 74 is then planarized, for example by a using a chemical mechanical planarizing (CMP) process so that the semiconductor device appears as shown in FIG.

10C. The layer 93 of sacrificial material 75 is then removed, again preferably using an etching process, leaving a first electrode 72 as shown in FIGS. 6D or 6E on the surface of layer 66 of barrier material 68. The capacitor structure is then completed as described previously.

Referring back to FIGS. 2 and 3, after the first electrode 72 has been formed into the nodular shape, the layer 78 of dielectric material 80 is formed on the first electrode 72. Desirably, the layer 78 of dielectric material 80 is deposited by RF magneton sputtering at a temperature from about 600° C. to about 700° C. under a vacuum. A target material can be prepared from a stoichiometric composition of powder materials. The thickness of the layer 78 of electrode material 80 is desirably from about 10 nm to about 200 nm, although thinner and thicker layers are contemplated. Other useful deposition techniques include CVD, LPCVD, PECVD and MOCVD. As described above, the nodular shape of the first electrode 72 provides a smooth topography for the deposition of the layer 78 of dielectric material 80.

After the layer 78 of dielectric material 80 has been deposited on the first electrode 72, the layer 82 of second electrode material 84 is formed on the layer 78 to provide a second electrode 86. The layer 82 is deposited by sputtering or a CVD-based process, such as LPCVD, PECVD or MOCVD. The layer 82 of second electrode material 84 desirably has a thickness of from about 20 nm to about 200 nm.

FIGS. 7A through 7D depict the process used to form the capacitor 100, as shown in FIGS. 4 and 5. This process is identical to the process described above except that no layer of barrier material is formed.

Figure 7A:
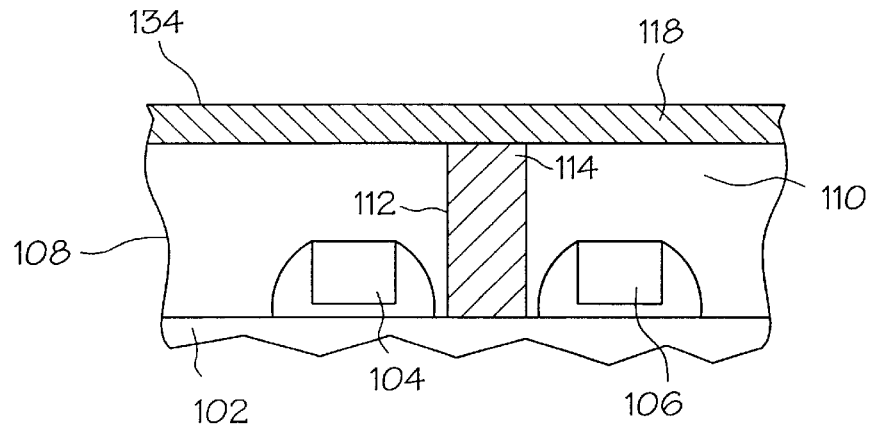
FIGS. 7A–7D are cross sectional views depicting the formation of the capacitors shown in FIGS. 4 and 5.

As shown in FIG. 7A, the layer 108 of insulating material 110 is formed on the semiconductor substrate 102. The layer 108 of insulating material 110 is formed over the first gate electrode 104 and the second gate electrode 106 by techniques which are known in the art. The contact via 112 is formed in the layer 108 of insulating material 110 by any conventional etching technique such as those described above for forming the contact via 62.

After the contact via 112 is formed in the layer 108 of insulating material 110, the contact 114 is formed in the contact via 112 in the layer 108. The contact 114 is formed by any conventional deposition process, such as, chemical vapor deposition (CVD), LPCVD, PECVD, MOCVD or sputtering, followed by a dry anisotropic etch. Desirably, the contact 114 is planarized to make it substantially coplanar with the surface of the layer 108 of insulating material 110. The layer 108 can be planarized by a conventional etching process or by chemical mechanical polishing. Desirably, the layer 108 is planarized by a chemical mechanical polishing process.

Once the contact 114 has been formed in the contact via 112, a layer 134 of first electrode material 118 is formed on the layer 108 of insulating material 110. The layer 134 is formed by CVD, LPCVD, PECVD, MOCVD, sputtering or other suitable deposition technique. The layer 134 is deposited at a thickness on the order of from about 10 nm to about 100 nm.

Figure 7B:
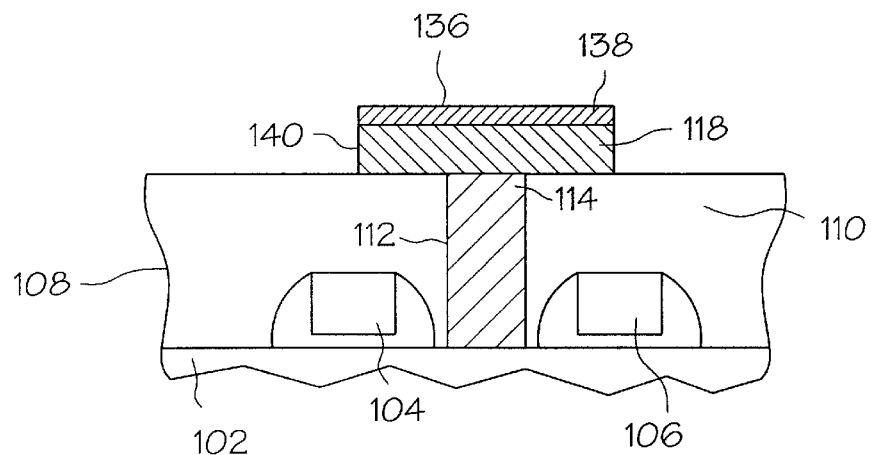

As shown in FIG. 7B, a layer 136 of a photoresist material 138 is formed on the electrode material 118. The layer 136 of photoresist material 138 is then patterned and etched to form a block 140 of electrode material 118 on the surface of the layer 108 of insulating material 110. The block 140 can be formed by any conventional etching method, either wet or dry etching. Desirably, the block 140 is formed by means of a dry etch to avoid any isotropic etching of the block 140.

The block 140 is formed by the etching processes so that it has a discrete and finite shape. In other words, the layer 134 of electrode material 118 is etched so that it is no longer in a continuous or semi-continuous form. The block 140 is formed so that it has a width that is equal to or greater than the width of the contact 114.

Figure 7C:
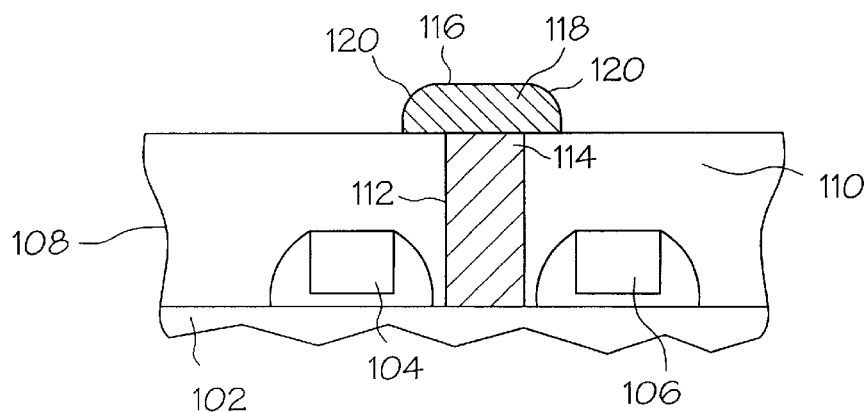

With reference to FIG. 7C, the block 140 of electrode material 118, shown in FIG. 7B, is etched to form the electrode 116, shown in FIG. 7C. The electrode 116 has a nodular shape which means that the electrode 116 has curved or rounded corners 120, as shown in FIG. 7C. The curved corners 120 are formed by means of a wet etch to provide the nodular shape.

Figure 7D:
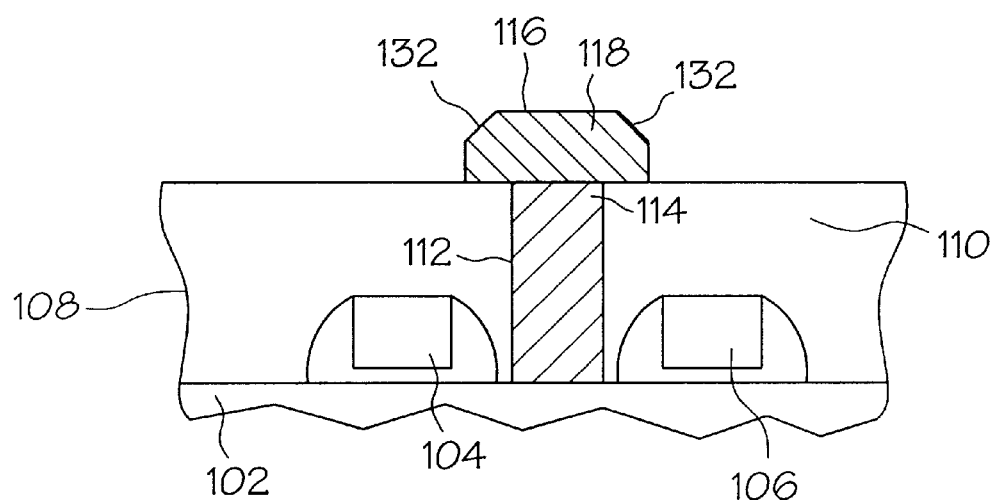

With reference to FIG. 7D, the block 140 of electrode material 118, shown in FIG. 7B, can be facet etched to provide the electrode 116 with faceted corners 130, as shown in FIG. 7D. A useful facet etching process is described in commonly assigned U.S. Pat. No. 5,320,981 to Blalock which has been described above.

Referring back to FIGS. 4 and 5, after the first electrode 116 has been formed into the nodular shape, the layer 122 of dielectric material 124 is formed on the first electrode 116. Desirably, the layer 122 of dielectric material 124 is deposited by RF magneton sputtering at a temperature from about 600° C. to about 700° C. under a vacuum. A target material can be prepared of a stoichiometric composition of powder materials. The thickness of the layer 122 of electrode material 124 is desirably from about 10 nm to about 200 nm, although thinner and thicker layers are contemplated. Other useful deposition techniques include CVD, LPCVD, PECVD and MOCVD. As described above, the nodular shape of the first electrode 116 provides a smooth topography for the deposition of the layer 122 of dielectric material 124.

After the layer 122 of dielectric material 124 has been deposited on the first electrode 116, the layer 126 of second electrode material 128 is formed on the layer 122 to provide a second electrode 130. The layer 126 is deposited by sputtering or an CVD-based process, such as LPCVD, PECVD or MOCVD. The layer 126 of second electrode material 128 desirably has a thickness of from about 20 nm to about 200 nm.

Figure 1:
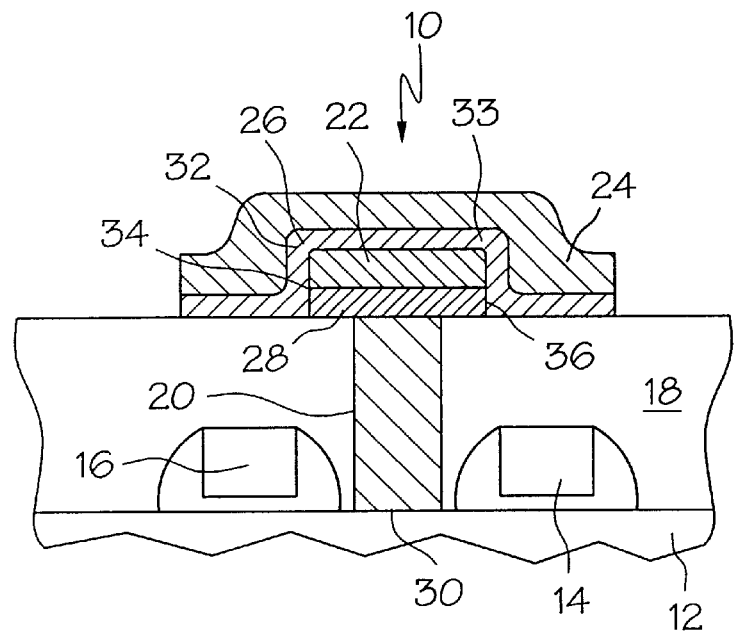
FIG. 1 presents a cross sectional view of a prior art stacked capacitor.

By providing the first electrodes 72 and 116 with a nodular shape, the prior art problem of improper step coverage can be avoided. The nodular shaped electrodes 72 and 116 allow for an even coverage of the of the other layers of the capacitor, the layers of dielectric material and the layer of second electrode material, on the first electrodes 72 and 116. This even coverage reduces, if not eliminates, charge leakage from the corners 32 and 33 of the prior art capacitor 10 shown in FIG. 1.

Further, the process of the present invention also provides for proper contact of the first electrodes 72 and 116 with the layer 66 of barrier material 68 and the contact 114, respectively, by providing sufficient overlap of the layer 92 of first electrode material 74 and the layer 134 of first electrode material 118 over the layer 66 of barrier material 68 and the contact 114, respectively. This overlap enhances the alignment of the first electrode 72 with the layer 66 of barrier material 68 and of the first electrode 116 with the contact 114.

Figure 8:
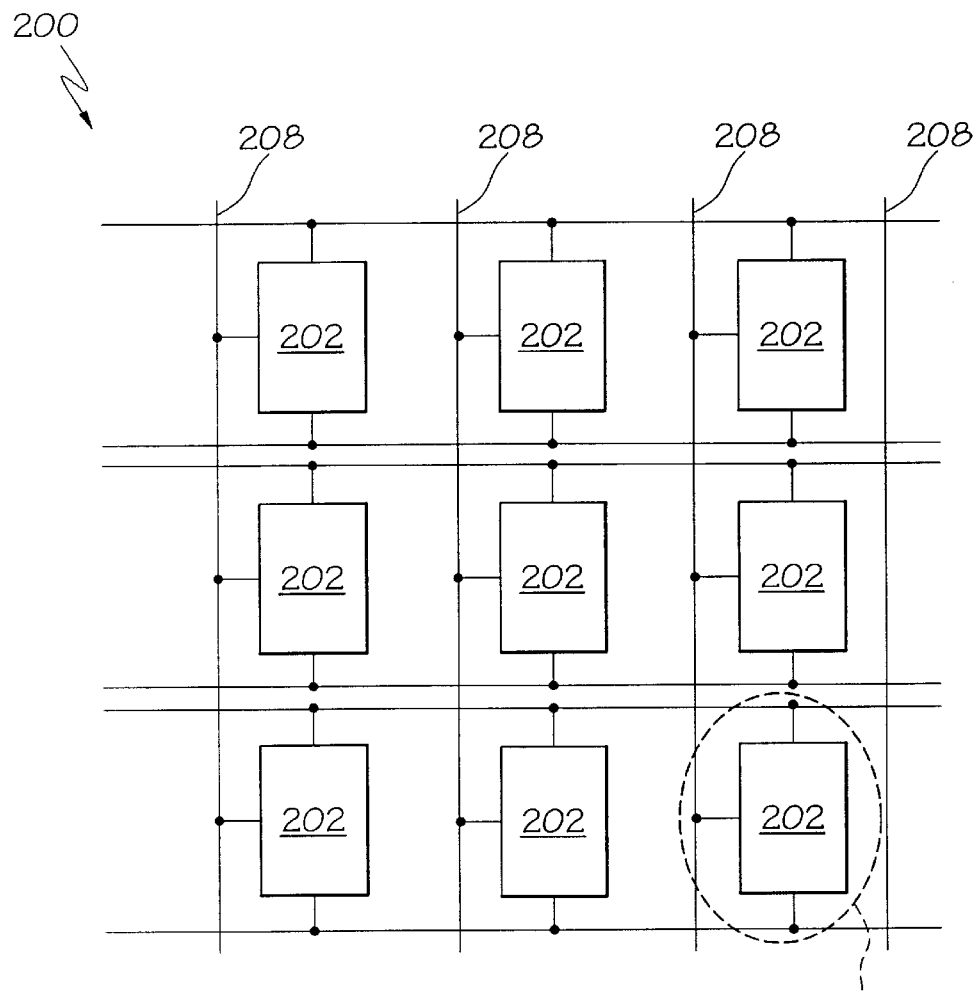
FIG. 8 is a schematic diagram of a DRAM array having a plurality of memory cells arranged in rows and columns.
Figure 8A:
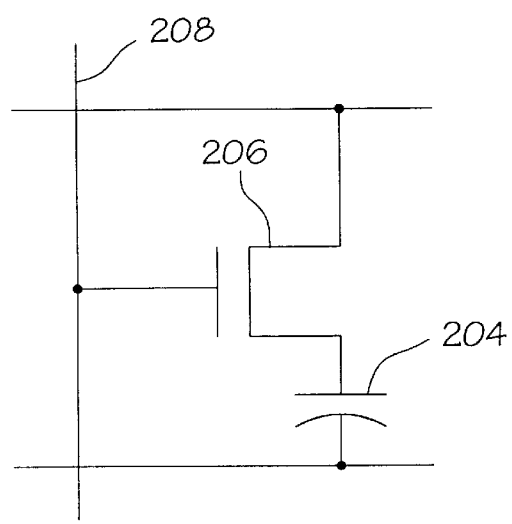
FIG. 8A is a schematic diagram of a representative memory cell of the DRAM array of FIG. 8 which employs a capacitor of the present invention.

The capacitors 50 and 100 may be used in a typical dynamic random access memory (DRAM) array 200, as shown in FIG. 8. The DRAM array 200 comprises a plurality of memory cells 202 arranged in rows and columns. As shown in FIG. 8A, each of the memory cells 202 includes at least one capacitor 204. The capacitor 204 may be either the capacitor 50, described above and shown in FIGS. 2 and 3, or the capacitor 100, described above and shown in FIGS. 4 and 5. The processes for forming each of the capacitors 50 and 100 are described above. Each capacitor 204 is coupled to a field effect transistor (FET) 206 which includes a source, a drain and a gate. The gate of the FET 206 is coupled to a word line 208 via an interconnect structure. It should be apparent that other devices such as other FET transistors, bipolar transistors, resistors, other capacitors and the like, may be interconnected with the capacitor 204. Further, it should be noted that a different capacitor, either capacitor 50 or capacitor 100, can be formed on a different memory cell 202. In other words, the capacitors formed on the memory cells 202 of the memory array 200 do not necessarily have to be the same type of capacitor.

Figure 9:
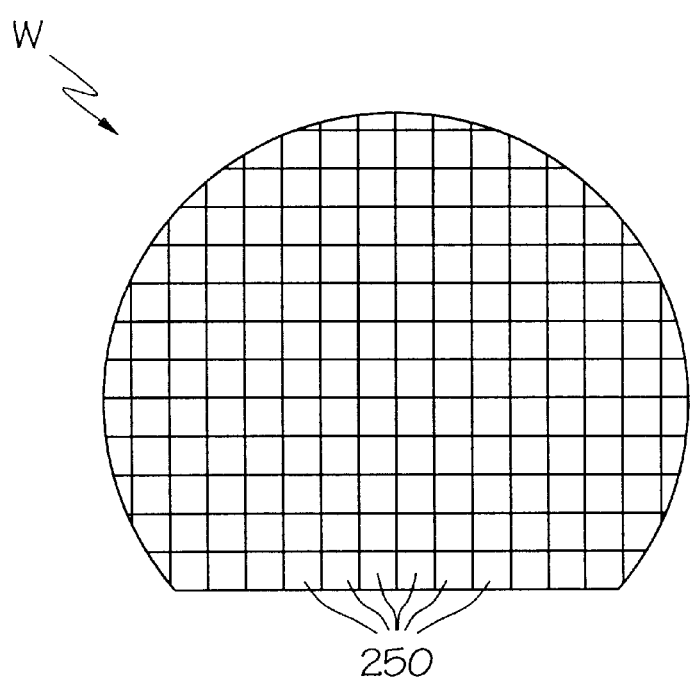
FIG. 9 is a top view of a wafer which includes a capacitor of the present invention.

The capacitors 50 and 100 of the present invention may also used in the fabrication of a wafer W, as is shown in FIG. 9. The wafer W includes a plurality of individual die 250 formed on a semiconductor substrate. Wafer masks (not shown) are used to apply a desired circuit structure on each of the individual die 250. The desired circuit structure may comprise any of the above described structures, e.g., the DRAM array 200. The wafer W is processed using standard wafer fabrication techniques.

Having described the invention in detail and by reference to preferred embodiments thereof, it will be apparent that modifications and variations are possible without departing from the scope of the invention which is defined in the appended claims.

What is claimed is:

1. A method for forming a capacitor for a semiconductor device comprising the steps of:
    forming a contact in a layer of an insulating material, said layer of insulating material being formed over a semiconductor substrate;
    forming a layer of a first electrode material on said layer of insulating material, said layer of said first electrode material being formed in contact with said contact;
    etching said layer of said first electrode material to form a first electrode having a nodular shape;
    forming a layer of a dielectric material on said first electrode;
    forming a second electrode on said layer of said dielectric material; and
    wherein said step of etching said layer of said first electrode material is a facet etch.

2. A method for forming a capacitor for a semiconductor device comprising the steps of:
    forming a contact in a layer of an insulating material, said layer of insulating material being formed over a semiconductor substrate and having a surface;
    etching said contact to form a barrier hole;
    forming a layer of a barrier material in said barrier hole such that said layer of barrier material contacts said contact and is substantially coplanar with said surface of said layer of insulating material;
    forming a layer of a first electrode material on said layer of barrier material, said layer of first electrode material being formed over said layer of insulating material;
    etching said layer of said first electrode material to form a first electrode having a nodular shape;
    forming a layer of a dielectric material on said first electrode;
    forming a second electrode on said layer of said dielectric material; and
    wherein said step of etching said first electrode is a wet etch.

3. A method for forming a capacitor for a semiconductor device comprising the steps of:
    forming a contact in a layer of an insulating material, said layer of insulating material being formed over a semiconductor substrate and having a surface;
    etching said contact to form a barrier hole;
    forming a layer of a barrier material in said barrier hole such that said layer of barrier material contacts said contact and is substantially coplanar with said surface of said layer of insulating material;
    forming a layer of a first electrode material on said layer of barrier material, said layer of first electrode material being formed over said layer of insulating material;
    etching said layer of said first electrode material to form a first electrode having a nodular shape;
    forming a layer of a dielectric material on said first electrode;
    forming a second electrode on said layer of said dielectric material; and
    wherein said step of etching said first electrode is a facet etch.

4. A method for forming a capacitor for a semiconductor device comprising the steps of:
    forming a contact in a layer of an insulating material, said layer of insulating material being formed over a semiconductor substrate and having a surface;
    etching said contact to form a barrier hole;
    forming a layer of a barrier material in said barrier hole such that said layer of barrier material contacts said contact and is substantially coplanar with said surface of said layer of insulating material;
    forming a layer of a sacrificial material on said layer of barrier material, said layer of sacrificial material being formed on said layer of insulating material;
    etching an opening in said layer of sacrificial material to expose said layer of barrier material;
    forming a first electrode in said opening on said layer of barrier material;
    removing said layer of sacrificial material;
    forming a layer of a dielectric material on said first electrode; and
    forming a second electrode on said layer of said dielectric material.

5. A method for forming a semiconductor device comprising the steps of:
    providing a semiconductor substrate;
    forming a layer of an insulating material over said semiconductor substrate, said layer of insulating material having a surface;
    forming a contact via in said layer of said insulating material;
    depositing, by chemical vapor deposition, a contact in said contact via;
    planarizing said contact to make said contact substantially coplanar with said surface of said layer of insulation material;
    depositing a layer of a first electrode material on the surface of said layer of insulation material, said first electrode material contacting said contact;
    patterning said layer of said first electrode material;
    dry etching said layer of said first electrode material to form a discrete block of said first electrode material;

etching said block of said first electrode material to form a first electrode having a nodular shape;

forming a layer of dielectric material on said first electrode; and forming a second electrode on said layer of dielectric material.

6. The method of claim 5 wherein said step of etching said block of said first electrode material to form a first electrode having a nodular shape is performed with a wet etch process.

7. The method of claim 5 wherein said step of etching said block of said first electrode material to form a first electrode having a nodular shape is performed with a facet etch process.

8. A method for forming a semiconductor device comprising the steps of:

providing a semiconductor substrate;

forming a layer of an insulating material over said semiconductor substrate, said layer of insulating material having a surface;

forming a contact via in said layer of said insulating material;

depositing, by chemical vapor deposition, a contact in said contact via;

planarizing said contact to make said contact substantially coplanar with the surface of said layer of insulation material;

over etching said contact to form a barrier hole;

forming a layer of a barrier material in said barrier hole;

polishing said layer of barrier material so that said layer of barrier material is substantially coplanar with said surface of said layer of insulating material;

depositing a layer of a first electrode material on the surface of said layer of insulation material, said first electrode material contacting said layer of barrier material;

patterning said layer of said first electrode material;

dry etching said layer of said first electrode material to form a discrete block of first electrode material;

etching said block of said first electrode material to form a first electrode having a nodular shape;

forming a layer of dielectric material on said first electrode;

forming a second electrode on said layer of dielectric material; and wherein said step of etching said block of said first electrode material to form a first electrode having a nodular shape is performed with a wet etch process.

9. A method for forming a semiconductor device comprising the steps of:

providing a semiconductor substrate;

forming a layer of an insulating material over said semiconductor substrate, said layer of insulating material having a surface;

forming a contact via in said layer of said insulating material;

depositing, by chemical vapor deposition, a contact in said contact via;

planarizing said contact to make said contact substantially coplanar with the surface of said layer of insulation material;

over etching said contact to form a barrier hole;

forming a layer of a barrier material in said barrier hole;

polishing said layer of barrier material so that said layer of barrier material is substantially coplanar with said surface of said layer of insulating material;

depositing a layer of a first electrode material on the surface of said layer of insulation material, said first electrode material contacting said layer of barrier material;

patterning said layer of said first electrode material;

dry etching said layer of said first electrode material to form a discrete block of first electrode material;

etching said block of said first electrode material to form a first electrode having a nodular shape;

forming a layer of dielectric material on said first electrode;

forming a second electrode on said layer of dielectric material; and wherein said step of etching said block of said first electrode material to form a first electrode having a nodular shape is performed with a facet etch process.

10. A method for forming a memory array, said memory array comprising a plurality of memory cells arranged in rows and columns, each of said plurality of memory cells comprising at least one field effect transistor, said method comprising the steps of:

providing a semiconductor substrate;

forming sources, drains and gates for each of said field effect transistors on said semiconductor substrate;

forming a layer of an insulating material over said semiconductor substrate;

forming at least one contact via in said layer of insulating material, each of said contact vias communicating with one of said source or said drain of one of said field effect transistors;

forming a contact in each of said contact vias, each of said contacts contacting one of said sources or said drains of said field effect transistors;

forming a layer of a first electrode material on said layer of insulating material on each of said contacts;

etching each of said layers of first electrode material to provide a series of first electrodes, each of said first electrodes having a nodular shape and contacting one of said contacts;

forming a layer of a dielectric material on each of said first electrodes;

forming a second electrode on each of said layers of dielectric material; an wherein said step of etching each of said layers of first electrode material to provide a series of first electrodes is performed with a facet etch process.

11. A method for forming a memory array, said memory array comprising a plurality of memory cells arranged in rows and columns, each of said plurality of memory cells comprising at least one field effect transistor, said method comprising the steps of:

providing a semiconductor substrate;

forming sources, drains and gates for each of said field effect transistors over said semiconductor substrate;

forming a layer of an insulating material over said semiconductor substrate;

forming at least one contact via in said layer of insulating material, each of said contact vias communicating with one of said source or said drain of one of said field effect transistors;

forming a contact in each of said contact vias, each of said contacts contacting one of said sources or said drains of one of said field effect transistors;

etching each of said contacts to provide a series of barrier holes;

forming a layer of a barrier material in each of said barrier holes;

forming a layer of a first electrode material on said layer of insulating material on each of said layers of barrier material;

etching each of said layers of first electrode material to provide a series of first electrodes, each of said first electrodes having a nodular shape;

forming a layer of a dielectric material on each of said first electrodes;

forming a second electrode on each of said layers of dielectric material; and wherein said step of etching each of said layers of first electrode material to provide a series of first electrodes is performed with a wet etch process.

12. A method for forming a memory array said memory array comprising a plurality of memory cells arranged in rows and columns, each of said plurality of memory cells comprising at least one field effect transistor, said method comprising the steps of:

providing a semiconductor substrate;

forming sources, drains and gates for each of said field effect transistors over said semiconductor substrate;

forming a layer of an insulating material over said semiconductor substrate;

forming at least one contact via in said layer of insulating material, each of said contact vias communicating with one of said source or said drain of one of said field effect transistors;

forming a contact in each of said contact vias, each of said contacts contacting one of said sources or said drains of one of said field effect transistors;

etching each of said contacts to provide a series of barrier holes;

forming a layer of a barrier material in each of said barrier holes;

forming a layer of a first electrode material on said layer of insulating material on each of said layers of barrier material;

etching each of said layers of first electrode material to provide a series of first electrodes, each of said first electrodes having a nodular shape;

forming a layer of a dielectric material on each of said first electrodes;

forming a second electrode on each of said layers of dielectric material; and wherein said step of etching each of said layers of first electrode material to provide a series of first electrodes is performed with a facet etch process.

13. A method for fabricating a wafer comprising:

providing a wafer including a semiconductor substrate;

forming a repeating series of sources, drains and gates for at least one field effect transistor on each of a plurality of individual die over said semiconductor substrate;

forming a layer of an insulating material over said semiconductor substrate, said layer of insulating material having a surface;

forming at least one contact via in said layer of insulating material on each of said individual die, said via exposing one of said sources or said drains;

forming a contact in each of said contact vias on each of said individual die, said contact contacting one of said sources or said drains and said contact being substantially coplanar with the surface of said layer of insulating material;

forming a layer of a first electrode material on said contact on said surface of said layer of insulating material on each of said individual die;

etching each of said layers of first electrode material to form a series of first electrodes having a nodular shape on each of said individual die;

forming a layer of a dielectric material on each of said first electrodes on each of said individual die;

forming a second electrode on each of said layers of dielectric material on each of said individual die; and wherein the step of etching said layer of first electrode material is performed with a facet etch.

14. A method for fabricating a wafer comprising:

providing a wafer including a semiconductor substrate;

forming a repeating series of sources, drains and gates for at least one field effect transistor on each of a plurality of individual die on said semiconductor substrate;

forming a layer of an insulating material over said semiconductor substrate, said layer of insulating material having a surface;

forming at least one contact via in said layer of insulating material on each of said individual die, said contact via exposing one of said sources or said drains;

forming a contact in each of said contact vias on each of said individual die, said contact contacting one of said sources or said drains and said contact being substantially coplanar with the surface of said layer of insulating material;

etching each of said contacts to form a barrier hole in each of said individual die;

forming a layer of a barrier material in each of said barrier holes on each of said individual die, said barrier material being flush with said surface of said layer of insulating material;

forming a layer of a first electrode material on each of said layers of barrier material on said surface of said layer of insulating material on each of said individual die;

etching each of said layers of first electrode material to form a series of first electrodes having a nodular shape on each of said individual die;

forming a layer of a dielectric material on each of said first electrodes on each of said individual die;

forming a second electrode on each of said layers of dielectric material on each of said individual die; and wherein the step of etching said layer of first electrode material is performed with a wet etch.

15. A method for fabricating a wafer comprising:

providing a wafer including a semiconductor substrate;

forming a repeating series of sources, drains and gates for at least one field effect transistor on each of a plurality of individual die on said semiconductor substrate;

forming a layer of an insulating material over said semiconductor substrate, said layer of insulating material having a surface;

forming at least one contact via in said layer of insulating material on each of said individual die, said contact via exposing one of said sources or said drains;

forming a contact in each of said contact vias on each of said individual die, said contact contacting one of said sources or said drains and said contact being substantially coplanar with the surface of said layer of insulating material;

etching each of said contacts to form a barrier hole in each of said individual die;

forming a layer of a barrier material in each of said barrier holes on each of said individual die, said barrier material being flush with said surface of said layer of insulating material;

forming a layer of a first electrode material on each of said layers of barrier material on said surface of said layer of insulating material on each of said individual die;

etching each of said layers of first electrode material to form a series of first electrodes having a nodular shape on each of said individual die;

forming a layer of a dielectric material on each of said first electrodes on each of said individual die;

forming a second electrode on each of said layers of dielectric material on each of said individual die; and wherein the step of etching said layer of first electrode material is performed with a facet etch.

* * * * *

UNITED STATES PATENT AND TRADEMARK OFFICE
CERTIFICATE OF CORRECTION

PATENT NO. : 6,218,259 B1
DATED : April 17, 2001
INVENTOR(S) : Salman Akram

Page 1 of 1

It is certified that error appears in the above-identified patent and that said Letters Patent is hereby corrected as shown below:

Column 2,
Line 9, reads "e.g. 600 C. to 700 C." should read -- e.g. 600 - C to 700 C --

Column 13,
Line 11, reads "about 600 C. to about 700 C." should read -- about 600 -- C to about 700 C --

Column 14,
Line 25, reads "about 600 C. to about 700 C." should read -- about 600 -- C to about 700 C --
Line 47, reads "coverage of the of the other layers" should read -- coverage of the other layers --

Column 18,
Line 46, reads "material; an" should read -- material; and --

Signed and Sealed this

Twenty-seventh Day of November, 2001

Attest:

NICHOLAS P. GODICI
Attesting Officer
Acting Director of the United States Patent and Trademark Office